(12) United States Patent
Hayashi

(10) Patent No.: US 9,957,611 B2
(45) Date of Patent: May 1, 2018

(54) REMOVAL DEVICE FOR SEMICONDUCTOR MANUFACTURING APPARATUS AND SEMICONDUCTOR MANUFACTURING APPARATUS

(71) Applicant: Kabushiki Kaisha Toshiba, Minato-ku, Tokyo (JP)

(72) Inventor: Hirokazu Hayashi, Ibo Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days. days.

(21) Appl. No.: 15/070,895

(22) Filed: Mar. 15, 2016

(65) Prior Publication Data

US 2017/0067152 A1  Mar. 9, 2017

(30) Foreign Application Priority Data

Sep. 7, 2015 (JP) .................. 2015-175952

(51) Int. Cl.
  *C23C 16/44* (2006.01)
  *C23C 16/52* (2006.01)
  *H01L 21/67* (2006.01)
  *C30B 25/14* (2006.01)

(52) U.S. Cl.
  CPC .......... *C23C 16/4412* (2013.01); *C30B 25/14* (2013.01); *H01L 21/67017* (2013.01)

(58) Field of Classification Search
  None
  See application file for complete search history.

(56) References Cited

U.S. PATENT DOCUMENTS

| 4,738,693 A | * | 4/1988 | Tom | .................. B01D 53/0446 95/263 |
| 6,107,198 A | * | 8/2000 | Lin | ....................... C23C 16/345 118/715 |
| 2013/0156950 A1 | * | 6/2013 | Yamada | .............. C23C 16/0236 427/248.1 |

FOREIGN PATENT DOCUMENTS

| JP | 05-175134 A | 7/1993 |
| JP | 05-198520 A | 8/1993 |
| JP | 10-032194 A | 2/1998 |

* cited by examiner

*Primary Examiner* — Jethro M Pence
(74) *Attorney, Agent, or Firm* — White & Case LLP

(57) ABSTRACT

Provided is a removal device for a semiconductor manufacturing apparatus according to an embodiment including a reservoir being connectable to a reaction chamber where a film is formed on a substrate and storing a byproduct derived from an exhaust gas exhausted from the reaction chamber, a vacuum generator driven by a driving gas, and a suction pipe having one connected to the reservoir and the other connected to the vacuum generator and suctioning the byproduct.

8 Claims, 1 Drawing Sheet

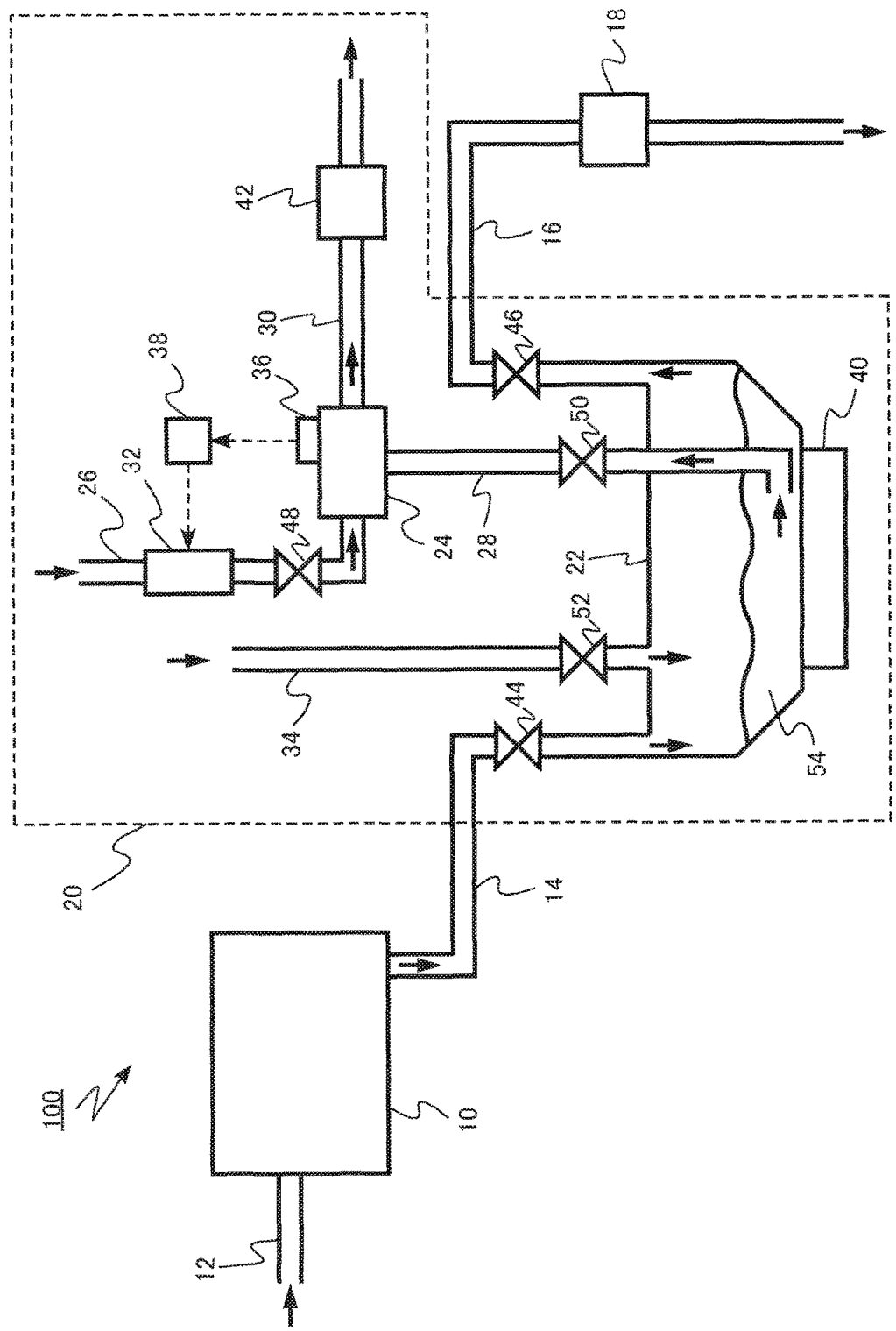

REMOVAL DEVICE FOR SEMICONDUCTOR MANUFACTURING APPARATUS AND SEMICONDUCTOR MANUFACTURING APPARATUS

CROSS-REFERENCE TO RELATED APPLICATION

This application is based upon and claims the benefit of priority from Japanese Patent Application No. 2015-175952, filed on Sep. 7, 2015, the entire contents of which are incorporated herein by reference.

FIELD

Embodiments described herein relate generally to a removal device for a semiconductor manufacturing apparatus and a semiconductor manufacturing apparatus.

BACKGROUND

When a silicon film is formed on a substrate, as a source gas, a gas containing silicon, chlorine, and hydrogen, for example, dichlorosilane ($SiH_2Cl_2$) is supplied to the reaction chamber. After the silicon film is formed, an exhaust gas exhausted from the reaction chamber contains an unreacted source gas. Therefore, as a byproduct derived from the exhaust gas, a liquid chlorosilane polymer or the like is attached to an exhaust pipe connected to the reaction chamber. The chlorosilane polymer is also referred to as an oily silane.

Since the chlorosilane polymer has a high viscosity, if the chlorosilane polymer is left as it is, the exhaust pipe is clogged, so that there is a problem in that trouble occurs in the formation of the silicon film. In addition, since the chlorosilane polymer has ignitability, the removal process is accompanied with a risk. For this reason, there is a problem in that the removal process of the chlorosilane polymer takes time and effort.

BRIEF DESCRIPTION OF THE DRAWINGS

FIG. 1 is a schematic diagram of a semiconductor manufacturing apparatus according to an embodiment.

DETAILED DESCRIPTION

A removal device for a semiconductor manufacturing apparatus according to an embodiment includes a reservoir being connectable to a reaction chamber where a film is formed on a substrate and storing a byproduct derived from an exhaust gas exhausted from the reaction chamber, a vacuum generator driven by a driving gas, and a suction pipe having one connected to the reservoir and the other connected to the vacuum generator and suctioning the byproduct.

Hereinafter, embodiments of the present invention will be described with reference to the drawings. In addition, in the description hereinafter, the same or similar components are denoted by the same reference numerals, and the components or the like described once are appropriately omitted in description.

A semiconductor manufacturing apparatus according to an embodiment includes a reaction chamber where a film is formed on a substrate, a first exhaust pipe being connected to the reaction chamber and exhausting an exhaust gas exhausted from the reaction chamber, a second exhaust pipe exhausting the exhaust gas, a reservoir being connected between the first exhaust pipe and the second exhaust pipe and storing a byproduct derived from the exhaust gas, a vacuum generator, a driving gas supply pipe being connected to the vacuum generator and supplying a driving gas to the vacuum generator, a suction pipe having one end connected to the reservoir and the other end connected to the vacuum generator and suctioning the byproduct, and a discharge pipe being connected to the vacuum generator and discharging the byproduct.

FIG. 1 is a schematic diagram of a semiconductor manufacturing apparatus according to the embodiment.

The semiconductor manufacturing apparatus according to the embodiment is a vapor phase growth apparatus of forming a film on a substrate. Hereinafter, as a vapor phase growth apparatus, an epitaxial growth apparatus 100 of forming a single crystal silicon film on a single crystal silicon wafer is exemplified.

The epitaxial growth apparatus 100 is configured to include a reaction chamber 10, a source gas supply pipe 12, a first exhaust pipe 14, a second exhaust pipe 16, a vacuum pump 18, and a removal device (removal device for a semiconductor manufacturing apparatus) 20. The removal device 20 is configured to include a reservoir 22, a vacuum generator 24, a driving gas supply pipe 26, a suction pipe 28, a discharge pipe 30, a heating mechanism 32, an inert gas supply pipe 34, a temperature sensor 36, a controller 38, a cooling/heating mechanism 40, and a detoxification device (detoxifying device) 42. In addition, the removal device 20 is configured to include a first opening/closing valve 44, a second opening/closing valve 46, a third opening/closing valve 48, a fourth opening/closing valve 50, and a fifth opening/closing valve 52.

In the reaction chamber 10, for example, a single crystal silicon film is formed on a single crystal silicon wafer (substrate).

The source gas supply pipe 12 is connected to the reaction chamber 10. The source gas supply pipe supplies a gas containing silicon, chlorine, and hydrogen, for example, dichlorosilane ($SiH_2Cl_2$) and trichlorosilane ($SiHCl_3$) as a source gas to the reaction chamber 10.

The first exhaust pipe 14 is connected to the reaction chamber 10. The first exhaust pipe 14 exhausts an exhaust gas exhausted from the reaction chamber 10 such as an unreacted source gas. The first exhaust pipe 14 is configured with the first opening/closing valve 44.

The second exhaust pipe 16 exhausts the exhaust gas exhausted from the reaction chamber 10 to the outside of the epitaxial growth apparatus 100. The second exhaust pipe 16 is configured with the second opening/closing valve 46.

The first exhaust pipe 14 and the second exhaust pipe 16 in the portions connected to the reaction chamber 10 are configured to be slanted with respect to, for example, the horizontal direction. For example, the pipes are configured to extend in the vertical direction.

The vacuum pump 18 is connected to the second exhaust pipe 16. The vacuum pump 18 reduces an internal pressure of the reaction chamber 10.

The removal device 20 is installed between the first exhaust pipe 14 and the second exhaust pipe 16. The removal device 20 has a function of removing a byproduct 54 derived from the exhaust gas exhausted from the reaction chamber 10.

The reservoir 22 is connected to the first exhaust pipe 14 and the second exhaust pipe 16. The reservoir 22 stores the byproduct 54 derived from the exhaust gas exhausted from the reaction chamber 10. The byproduct 54 is, for example, a liquid chlorosilane polymer (chlorosilane polymer). The chlorosilane polymer is also referred to as an oily silane.

The cooling/heating mechanism 40 is connected to, for example, the reservoir 22. The cooling/heating mechanism 40 cools or heats the reservoir 22. The cooling/heating mechanism 40 cools or heats the byproduct 54 by cooling or heating the reservoir 22. The cooling/heating mechanism 40 is, for example, a chiller.

The vacuum generator 24 has a function of obtaining a suction force (vacuum) by continuously supplying a driving gas.

The driving gas supply pipe 26 is connected to the vacuum generator 24. The driving gas supply pipe 26 supplies the driving gas for the vacuum generator 24 to the vacuum generator 24. The driving gas is, for example, an inert gas such as nitrogen or argon. The driving gas supply pipe 26 is configured with the third opening/closing valve 48.

The heating mechanism 32 is installed in the middle of the driving gas supply pipe 26. The heating mechanism 32 has a function of heating the driving gas. The heating mechanism 32 can heat the driving gas up to a vaporization temperature or more of the byproduct 54. From the point of view of the vaporization of the chlorosilane polymer, it is preferable that the heating mechanism can heat the driving gas up to 260° C. or more. The heating mechanism 32 is, for example, a heater.

The temperature sensor 36 is installed in the vacuum generator 24. The temperature sensor 36 directly or indirectly measures the temperature of a gas passing through the vacuum generator 24.

The controller 38 controls the heating mechanism 32 based on the measurement value of the temperature sensor 36. The controller 38 controls the heating mechanism 32 so that the temperature of the gas passing through the vacuum generator 24 becomes a desired temperature. The controller 38 is, for example, a control circuit. The control circuit is configured, for example, by hardware or software or in a combination of hardware and software.

The one end of the suction pipe 28 is connected to the reservoir 22, and the other end thereof is connected to the vacuum generator 24. The suction pipe 28 suctions the byproduct 54 stored in the reservoir 22. The end of the suction pipe 28 close to the reservoir 22 is installed near the bottom of the reservoir 22 in order to suction the byproduct 54. The suction pipe 28 is configured with the fourth opening/closing valve 50.

The discharge pipe 30 is connected to the vacuum generator 24. The discharge pipe 30 discharges the byproduct 54 suctioned by the suction pipe 28 to the outside of the epitaxial growth apparatus 100.

The detoxification device 42 is connected to the discharge pipe 30. The detoxification device 42 detoxifies, for example, a gas containing the byproduct 54. For example, the detoxification device removes chlorine from the gas containing the byproduct 54. The detoxification device 42 is, for example, a wet detoxifying device (scrubber) using water shower.

The inert gas supply pipe 34 is connected to the reservoir 22. The inert gas supply pipe 34 supplies an inert gas to the reservoir 22. The inert gas supply pipe 34 sets the pressure of the reservoir 22 to a positive pressure by supplying the inert gas to the reservoir 22. The inert gas is, for example, nitrogen or argon. The inert gas supply pipe 34 is configured with the fifth opening/closing valve 52.

Next, functions and effects of the epitaxial growth apparatus 100 and the removal device 20 according to the embodiment will be described. Hereinafter, a case where the byproduct 54 is a chlorosilane polymer is exemplified.

After the silicon film is formed, the exhaust gas exhausted from the reaction chamber 10 contains an unreacted source gas and the like. Therefore, as the byproduct 54 derived from the exhaust gas, a liquid chlorosilane polymer is attached to the first exhaust pipe 14 and the second exhaust pipe 16 connected to the reaction chamber 10.

Since the chlorosilane polymer has a high viscosity, if the chlorosilane polymer is left at it is, the first exhaust pipe 14 and the second exhaust pipe 16 are clogged, so that trouble occurs in the formation of the silicon film. In addition, since the chlorosilane polymer has ignitability, the removal process is accompanied with a risk. For this reason, the removal process takes time and effort. Therefore, it is preferable that the removal process for the chlorosilane polymer be performed without performing a manual operation such as pipe removal.

In the embodiment, during the film formation in the reaction chamber 10, the chlorosilane polymer derived from the exhaust gas exhausted from the reaction chamber 10 is stored in the reservoir 22. Since the chlorosilane polymer is a liquid, the chlorosilane polymer is stored on the bottom of the reservoir 22.

It is preferable that the first exhaust pipe 14 or the second exhaust pipe 16 connected to the reservoir 22 be slanted with respect to, for example, the horizontal direction. Since the pipe is slanted with respect to the horizontal direction, the chlorosilane polymer attached on the inner wall flows down through the first exhaust pipe 14 or the second exhaust pipe 16 by gravity and enters the reservoir 22 to be stored in the reservoir 22.

In addition, it is preferable that the reservoir 22 be cooled or heated at an appropriate temperature by the cooling/heating mechanism 40. For example, the reservoir 22 is cooled, so that liquefaction of the chlorosilane polymer in the exhaust gas is facilitated. Therefore, capturing efficiency of the chlorosilane polymer to the reservoir 22 is improved. In addition, for example, the viscosity of the chlorosilane polymer depends on temperature. When the chlorosilane polymer is removed, an appropriate temperature is set, so that the viscosity can be decreased. Therefore, the chlorosilane polymer is easily removed.

In the time other than the film formation in the reaction chamber 10, the chlorosilane polymer stored in the reservoir 22 is removed. First, the first opening/closing valve 44 and the second opening/closing valve 46 are closed. Next, the temperature of the reservoir 22 is adjusted by the cooling/heating mechanism 40 so that the temperature becomes a desired temperature where the viscosity of the chlorosilane polymer is decreased. The desired temperature is, for example, the room temperature. Next, the fifth opening/closing valve 52 is opened to supply the inert gas from the inert gas supply pipe 34 to the reservoir 22 so that the pressure of the reservoir 22 is set to a positive pressure. At this time, the fourth opening/closing valve 50 of the suction pipe 28 is closed. After that, the fifth opening/closing valve 52 is closed, so that the supplying of the inert gas is stooped.

Next, the third opening/closing valve 48 is opened to supply the inert gas from the driving gas supply pipe 26 to the vacuum generator 24. Next, the fourth opening/closing valve 50 of the suction pipe 28 is opened. By the suction force generated by the vacuum generator 24, the chlorosilane polymer collected on the bottom of the reservoir 22 is suctioned through the suction pipe 28. Since the chlorosilane polymer is suctioned by the suction force generated by the vacuum generator 24, the highly-viscous chlorosilane polymer can be removed.

The suctioned chlorosilane polymer is discharged to the outside of the epitaxial growth apparatus 100 by the discharge pipe 30. It is preferable that the detoxification device 42 be installed at the preceding stage of the discharging to the outside of the epitaxial growth apparatus 100 to detoxify the chlorosilane polymer.

It is preferable that the driving gas be heated by using the heating mechanism 32. In particular, it is preferable that the driving gas be heated up to the vaporization temperature or more of the chlorosilane polymer. For example, it is preferable that the driving gas be heated up to 260° C. or more.

Since the driving gas is heated, the liquid chlorosilane polymer suctioned by the suction pipe 28 is vaporized in the vacuum generator 24 to be transported by the driving gas. Therefore, the chlorosilane polymer is easily transported. In addition, since the chlorosilane polymer is vaporized, the removal process for the chlorine by the detoxification device 42 is facilitated.

In addition, the temperature sensor 36 and the controller 38 are used, so that the temperature of the gas passing through the vacuum generator 24 can be controlled to be stabilized at the vaporization temperature or more of the chlorosilane polymer.

If the removal of the chlorosilane polymer stored in the reservoir 22 is completed, the fourth opening/closing valve 50 and the third opening/closing valve 48 are closed.

According to the epitaxial growth apparatus 100 and the removal device 20 according to the embodiment, the chlorosilane polymer in the exhaust pipe generated in the film formation can be removed. Therefore, by clogging the exhaust pipe, occurrence of trouble in the film formation can be suppressed.

In addition, the removal process for the chlorosilane polymer can be performed without detaching pipes. Therefore, the removal process for the chlorosilane polymer is facilitated. In addition, in comparison with the case where the pipes are manually detached and the removal process is performed, the safety of the removal process is improved.

According to the epitaxial growth apparatus 100 and the removal device 20 according to the embodiment, the byproduct 54 in the film formation can be conveniently removed.

While certain embodiments have been described, these embodiments have been presented by way of example only, and are not intended to limit the scope of the inventions. Indeed, a removal device for a semiconductor manufacturing apparatus and a semiconductor manufacturing apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A removal device for a semiconductor manufacturing apparatus, comprising:
    a reservoir capable of being connected to a reaction chamber configured to forma film on a substrate, the reservoir storing byproduct derived from an exhaust gas exhausted from the reaction chamber;
    a vacuum generator driven by a driving gas, the vacuum generator configured to generate a suction force by the driving gas;
    a driving gas supply pipe connected to the vacuum generator, the driving gas supply pipe configured to supply the driving gas to the vacuum generator;
    a suction pipe having one end connected to the reservoir and the other end connected to the vacuum generator, the suction pipe suctioning configured to suction the byproduct from the reservoir by the suction force generated by the vacuum generator;
    a discharge pipe connected to the vacuum generator, the discharge pipe configured to discharge the byproduct suctioned by the vacuum generator and the suction pipe;
    a heating mechanism heating the driving gas;
    a temperature sensor measuring temperature of the driving gas passing the vacuum generator; and
    a controller controlling the heating mechanism based on a measurement value of the temperature sensor.

2. The removal device for a semiconductor manufacturing apparatus according to claim 1, further comprising a cooling/heating mechanism cooling or heating the reservoir.

3. The removal device for a semiconductor manufacturing apparatus according to claim 1, further comprising an inert gas supply pipe being connected to the reservoir, the inert gas supply pipe supplying an inert gas to the reservoir.

4. The removal device for a semiconductor manufacturing apparatus according to claim 1, further comprising a driving gas supply pipe being connected to the vacuum generator, the driving gas supply pipe supplying the driving gas to the vacuum generator.

5. The removal device for a semiconductor manufacturing apparatus according to claim 1, further comprising a discharge pipe being connected to the vacuum generator, the discharge pipe discharging the byproduct.

6. The removal device for a semiconductor manufacturing apparatus according to claim 5, further comprising a detoxification device being connected to the discharge pipe.

7. The removal device for a semiconductor manufacturing apparatus according to claim 1, wherein the driving gas is nitrogen or argon.

8. The removal device for a semiconductor manufacturing apparatus according to claim 1, wherein the heating mechanism is capable of heating the driving gas up to a vaporization temperature or more.

* * * * *